(12) United States Patent
Zhao et al.

(10) Patent No.: US 9,647,009 B1
(45) Date of Patent: May 9, 2017

(54) TFT ARRAY SUBSTRATE STRUCTURE

(71) Applicant: Wuhan China Star Optoelectronics Technology Co., Ltd., Wuhan (CN)

(72) Inventors: Yu Zhao, Wuhan (CN); Zhandong Zhang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/084,497

(22) Filed: Mar. 30, 2016

(30) Foreign Application Priority Data

Jan. 12, 2016 (CN) .......................... 2016 1 0019481

(51) Int. Cl.
*H01L 27/12* (2006.01)
*G02F 1/1362* (2006.01)

(52) U.S. Cl.
CPC .... *H01L 27/1248* (2013.01); *G02F 1/136209* (2013.01); *G02F 1/136213* (2013.01); *H01L 27/1222* (2013.01); *H01L 27/1255* (2013.01)

(58) Field of Classification Search
CPC ........... H01L 27/1248; G02F 1/136213; G02F 1/136209
USPC .......................................................... 349/39
See application file for complete search history.

(56) References Cited

U.S. PATENT DOCUMENTS

| 5,734,449 | A | * | 3/1998 | Jang | G02F 1/136213 |
| | | | | | 349/111 |
| 5,815,226 | A | * | 9/1998 | Yamazaki | G02F 1/136209 |
| | | | | | 257/E21.413 |
| 6,741,313 | B2 | * | 5/2004 | Kim | G02F 1/136213 |
| | | | | | 349/139 |
| 7,532,263 | B2 | * | 5/2009 | Lee | G02F 1/136213 |
| | | | | | 257/59 |
| 7,728,915 | B2 | * | 6/2010 | Ting | G02F 1/136213 |
| | | | | | 349/147 |
| 2002/0089616 | A1 | * | 7/2002 | Hashimoto | G02F 1/136209 |
| | | | | | 349/44 |
| 2003/0063429 | A1 | * | 4/2003 | Watanabe | H01L 21/02164 |
| | | | | | 361/306.3 |
| 2003/0096459 | A1 | * | 5/2003 | Joo | G02F 1/13454 |
| | | | | | 438/149 |

(Continued)

*Primary Examiner* — Matthew Landau
*Assistant Examiner* — Grant Withers
(74) *Attorney, Agent, or Firm* — Leong C. Lei

(57) ABSTRACT

A TFT array substrate structure includes a patterned metal light-shielding layer that includes a plurality of metal light-shielding blocks arranged in an array and a narrowed metal strip connected between two adjacent ones of the metal light-shielding blocks. The metal light-shielding layer and a common electrode are connected to and receive a common voltage signal. For each of TFT, the pixel electrode is connected to a drain electrode of the TFT; the pixel electrode has a portion overlapping the common electrode to form a first storage capacitor; and the metal light-shielding layer has a portion overlapping the drain electrode and the pixel electrode to form a second storage capacitor. The first storage capacitor and the second storage capacitor are connected in parallel to increase the capacity of the storage capacitor. The metal light-shielding layer is arranged in a light-shielded area and thus the modification thereof does not affect aperture ratio.

10 Claims, 2 Drawing Sheets

(56) References Cited

U.S. PATENT DOCUMENTS

| | | | |
|---|---|---|---|
| 2003/0102479 A1* | 6/2003 | Joo | H01L 29/66757 257/72 |
| 2003/0180975 A1* | 9/2003 | Fujita | G02F 1/13454 438/17 |
| 2003/0230764 A1* | 12/2003 | Yamazaki | H01L 27/3244 257/200 |
| 2004/0056297 A1* | 3/2004 | Iki | H01L 27/146 257/306 |
| 2004/0119075 A1* | 6/2004 | Murade | H01L 27/1255 257/72 |
| 2005/0029521 A1* | 2/2005 | Yamasaki | G02F 1/136213 257/72 |
| 2008/0018816 A1* | 1/2008 | Hattori | G02F 1/136213 349/39 |
| 2008/0296581 A1* | 12/2008 | Chao | G02F 1/136213 257/71 |
| 2010/0188593 A1* | 7/2010 | Yamaguchi | G02F 1/136227 349/43 |
| 2010/0283059 A1* | 11/2010 | Nakazawa | H01L 23/552 257/66 |

* cited by examiner

TFT ARRAY SUBSTRATE STRUCTURE

BACKGROUND OF THE INVENTION

1. Field of the Invention

The present invention relates to the field of display technology, and in particular to a thin-film transistor (TFT) array substrate structure.

2. The Related Arts

Liquid crystal displays (LCDs) have a variety of advantages, such as thin device body, low power consumption, and being free of radiation, and thus have wide applications, such as liquid crystal televisions, mobile phones, personal digital assistants (PDAs), digital cameras, computer monitors, and notebook computer screens, making them take a leading position in the field of flat panel displays.

Most of the LCDs that are currently available in the market are backlighting LCDs, which comprise a liquid crystal display panel and a backlight module. The working principle of the liquid crystal display panel is that liquid crystal molecules are filled between a thin-film transistor (TFT) array substrate and a color filter (CF) substrate and a drive voltage is applied to the two substrates to control a rotation direction of the liquid crystal molecules in order to refract out light emitting from the backlight module to generate an image.

The TFT array substrate comprises a plurality of gate lines and data lines. The plurality of gate lines and the plurality of data lines are perpendicular to each other to define a plurality of pixel units. Each of the pixel units comprises therein a TFT, a pixel electrode, and a storage capacitor. The TFT has a gate electrode that is connected to the gate lines, a source electrode that is connected to the data lines, and a drain electrode that is connected to the pixel electrode. When the gate lines are driven, the TFT is set in a conducting state so that a grayscale voltage signal that is fed through the corresponding data line is loaded into the pixel electrode, whereby a corresponding electric field is generated between the pixel electrode and a common electrode. The liquid crystal molecules contained in the liquid crystal layer is acted upon by the electric field to change direction thereby achieving displaying of various images.

The storage capacitor provides important functions of maintaining a voltage level and reducing division voltage of coupling capacitance in the TFT array substrate. An existing TFT array substrate is structured to form a storage capacitor by means of an overlapping portion between the common electrode and the pixel electrode. Such a storage capacitor has a relatively small capacitance that does not suit the needs of high quality display panels. On the other hand, increasing the capacitance of the storage capacitor by expanding the overlapping portion between the common electrode and the pixel electrode would lead to reduction of aperture ratio of the panel.

In addition, an existing TFT array substrate is structured to include multiple independent light-shielding layers in the form of blocks, which provide a sole function of shielding a channel zone of a semiconductor layer of the TFT to prevent performance deterioration of the TFT resulting from photogenerated carrier generated in the channel zone by photoelectric effect.

SUMMARY OF THE INVENTION

An object of the present invention is to provide a thin-film transistor (TFT) array substrate structure, which increases the capacity of the storage capacitor, enhances the performance of a display, and improve product competition power, but does not reduce the aperture ratio.

To achieve the above objects, the present invention provides a TFT array substrate structure, which comprises: a backing plate, a patterned metal light-shielding layer formed on the backing plate, a first insulation layer covering on the patterned metal light-shielding layer, a plurality of TFTs formed on the first insulation layer and arranged in an array, a planarization layer covering the TFTs, a common electrode formed on the planarization layer, a protection layer covering on the common electrode, and a patterned pixel electrode formed on the protection layer;

the TFTs each comprising a semiconductor layer formed on the first insulation layer, a gate insulation layer covering on the semiconductor layer, a gate electrode arranged on the gate insulation layer and located above the semiconductor layer, an interlayer dielectric layer formed on the gate electrode and the gate insulation layer, and a source electrode and a drain electrode formed on the interlayer dielectric layer;

the patterned metal light-shielding layer comprising a plurality of metal light-shielding blocks arranged in an array and a narrowed metal strip connected between two adjacent ones of the metal light-shielding blocks, each of the metal light-shielding blocks being arranged to correspond to and located under one of the semiconductor layers;

the metal light-shielding layer and the common electrode being both connected to and receiving a common voltage signal, the pixel electrode being set in engagement with the drain electrode of the TFT;

wherein for each of the TFTs, the pixel electrode has a portion overlapping the common electrode to form first storage capacitor and the metal light-shielding layer has a portion overlapping the drain electrode and the pixel electrode to form a second storage capacitor, the first storage capacitor and the second storage capacitor being connected in parallel.

The semiconductor layer comprises a poly-silicon channel zone located at a middle portion and contact zones located at two ends and lightly doped zones sandwiched between the poly-silicon channel zone and the contact zones.

Each of the metal light-shielding blocks corresponds to and shields one of the poly-silicon channel zones.

The source electrode and the drain electrode are respectively set in connection with the contact zones at the two ends of the semiconductor layer through vias formed through the interlayer dielectric layer and the gate insulation layer.

The pixel electrode is set in connection with the drain electrode through a via extending through the protection layer, the common electrode, and the planarization layer.

The metal light-shielding layer is formed of a material comprising molybdenum or titanium.

The first insulation layer comprises, in sequence from bottom to top, a first silicon nitride layer and a first silicon oxide layer stacked on each other.

The interlayer dielectric layer comprises, in sequence from bottom to top, a second silicon oxide layer and a second silicon nitride layer stacked on each other.

The protection layer is made of a material comprising silicon nitride; and the gate electrode is formed of a material comprising molybdenum and the source electrode and the drain electrode are formed of a material comprising two layers of molybdenum sandwiching therebetween a layer of aluminum.

The pixel electrode and the common electrode are both formed of a material comprising indium tin oxide (ITO).

The backing plate comprises a glass plate.

The efficacy of the present invention is that the present invention provides a TFT array substrate structure, which comprises a patterned metal light-shielding layer that comprises a plurality of metal light-shielding blocks arranged in an array and a narrow metal strip connected between two adjacent ones of the metal light-shielding blocks, wherein the metal light-shielding layer and a common electrode both re connected to and receive a common voltage signal. For each TFT, the pixel electrode is connected to a drain electrode of the TFT; the pixel electrode has a portion overlapping the common electrode to form a first storage capacitor; and the metal light-shielding layer has a portion overlapping the drain electrode and the pixel electrode to form a second storage capacitor, so that the first storage capacitor and the second storage capacitor are connected in parallel to each other to increase the capacity of the storage capacitor; and further, since the metal light-shielding layer is originally provided for shielding light and is located to correspond to an area where light is to be shielded, the modification made here to the metal light-shielding layer does not affect the aperture ratio at all so that, without affecting the aperture ratio, the capacity of the storage capacitor is increased, the performance of a display panel is enhanced, and product competition power is improved.

BRIEF DESCRIPTION OF THE DRAWINGS

The features and technical contents of the present invention will be better understood by referring to the following detailed description and drawings the present invention. However, the drawings are provided for the purpose of reference and illustration and are not intended to limit the scope of the present invention. In the drawing.

DETAILED DESCRIPTION OF THE PREFERRED EMBODIMENTS

To further expound the technical solution adopted in the present invention and the advantages thereof, a detailed description is given to a preferred embodiment of the present invention with reference to the attached drawings.

Figure 1:
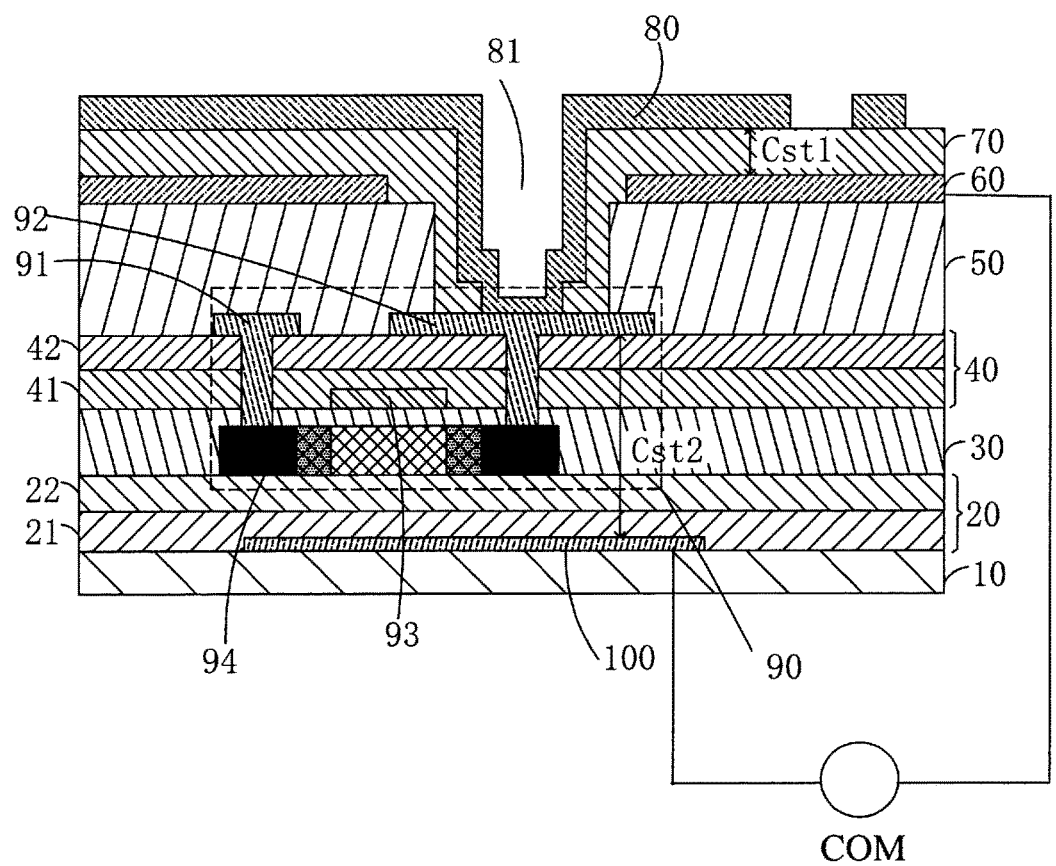
FIG. 1 is a cross-sectional view illustrating a thin-film transistor (TFT) array substrate structure according to the present invention.
Figure 2:
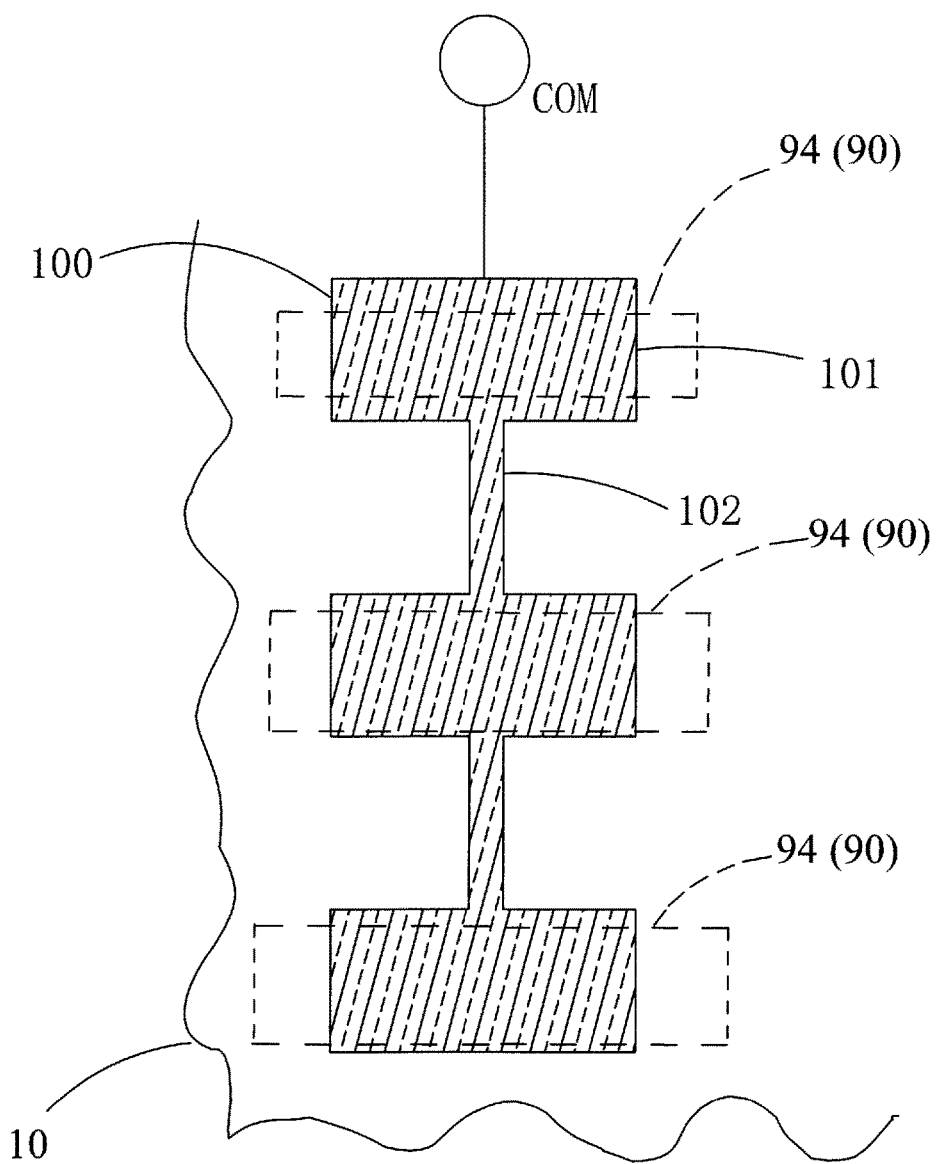
FIG. 2 is a top plan view showing a metal light-shielding layer of the TFT array substrate structure according to the present invention.

Referring to both FIGS. 1 and 2, the present invention provides a thin-film transistor (TFT) array substrate structure, which comprises: a backing plate 10, a patterned metal light-shielding layer 100 formed on the backing plate 10, a first insulation layer 20 covering on the patterned metal light-shielding layer 100, a plurality of TFTs 90 formed on the first insulation layer 20 and arranged in the form of an array, a planarization layer 50 covering on the TFTs 90, a common electrode 60 formed on the planarization layer 50, a protection layer 70 covering on the common electrode 60, and a patterned pixel electrode 80 formed on the protection layer 70.

Each of the TFTs 90 comprises: a semiconductor layer 94 formed on the first insulation layer 20, a gate insulation layer 30 covering on the semiconductor layer 94, a gate electrode 93 arranged on the gate insulation layer 30 and located above the semiconductor layer 94, an interlayer dielectric layer 40 formed on the gate electrode 93 and the gate insulation layer 30, and a source electrode 91 and a drain electrode 92 formed on the interlayer dielectric layer 40.

The patterned metal light-shielding layer 100 comprises a plurality of metal light-shielding blocks 101 arranged in the form of an array and a narrowed metal strip 102 connected between two adjacent ones of the metal light-shielding blocks 101. Each of the metal light-shielding blocks 101 is arranged to correspond to and located under one of the semiconductor layers 94. The patterned metal light-shielding layer 100 is formed by etching a metal film formed of molybdenum or titanium.

The metal light-shielding layer 100 and the common electrode 60 are both connected to and receive a common voltage signal COM. The pixel electrode 80 is set in engagement with the drain electrode 92 of the TFT 90 to form electrical connection therebetween.

For each of the TFTs 90, the pixel electrode 80 has a portion overlapping the common electrode 60 to form a first storage capacitor Cst1; and the metal light-shielding layer 100 has a portion overlapping the drain electrode 92 and the pixel electrode 80 to form a second storage capacitor Cst2. Since the pixel electrode 80 is in electrical connection with the drain electrode 92 of the TFT 90, the first storage capacitor Cst1 and the second storage capacitor Cst2a are connected in parallel to each other.

The parallel connection of the first storage capacitor Cst1 and the second storage capacitor Cst2 constitute a storage capacitor of the TFT array substrate. The capacity of the storage capacitor is equal to the sum of the capacities of the first storage capacitor Cst1 and the second storage capacitor Cst2. Compared to the prior art, the second storage capacitor Cst2 is additionally included, helping greatly increase the capacitor of the storage capacitor. Further, since the metal light-shielding layer 100 is originally provided for shielding light and is located to correspond to an area where light is to be shielded, the modification made here to the metal light-shielding layer 100 does not affect the aperture ratio at all so that, without affecting the aperture ratio, the capacity of the storage capacitor is increased, the performance of a display panel is enhanced, and product competition power is improved.

Specifically, the semiconductor layer 94 comprises a poly-silicon channel zone located at the middle and contact zones located at two ends and lightly doped zones sandwiched between the poly-silicon channel zone and the contact zones. Each of the metal light-shielding blocks 101 corresponds to and shields one of the poly-silicon channel zones. The gate electrode 93 is located exactly above the poly-silicon channel zone.

The source electrode 91 and the drain electrode 92 are respectively set in connection with the contact zones at the two ends of the semiconductor layer 94 through vias formed through the interlayer dielectric layer 40 and the gate insulation layer 30.

The pixel electrode 80 is set in connection with the drain electrode 92 through a via 81 extending through the protection layer 70, the common electrode 60, and the planarization layer 50.

Further, the backing plate 10 is a glass plate. The metal light-shielding layer 100 is formed of a material comprising molybdenum (Mo) or titanium (Ti). The first insulation layer 20 comprises, in sequence from bottom to top, a first silicon nitride ($SiN_x$) layer 21 and a first silicon oxide ($SiO_x$) layer 22 stacked on each other. The interlayer dielectric layer 40 comprises, in sequence from bottom to top, a second silicon oxide layer 41 and a second silicon nitride layer 42 stacked on each other. The protection layer 70 is made of a material comprising silicon nitride. The gate electrode 94 is formed of a material comprising molybdenum and the source electrode 91 and the drain electrode 92 are formed of a material comprising two layers of molybdenum sandwiching therebetween a layer of aluminum (Al). The pixel electrode 80 and the common electrode 60 are both formed of a material comprising a transparent conductive film of indium tin oxide (ITO).

In summary, the present invention provides a TFT array substrate structure, which comprises a patterned metal light-shielding layer that comprises a plurality of metal light-shielding blocks arranged in an array and a narrow metal strip connected between two adjacent ones of the metal light-shielding blocks, wherein the metal light-shielding layer and a common electrode both re connected to and receive a common voltage signal. For each TFT, the pixel electrode is connected to a drain electrode of the TFT; the pixel electrode has a portion overlapping the common electrode to form a first storage capacitor; and the metal light-shielding layer has a portion overlapping the drain electrode and the pixel electrode to form a second storage capacitor, so that the first storage capacitor and the second storage capacitor are connected in parallel to each other to increase the capacity of the storage capacitor; and further, since the metal light-shielding layer is originally provided for shielding light and is located to correspond to an area where light is to be shielded, the modification made here to the metal light-shielding layer does not affect the aperture ratio at all so that, without affecting the aperture ratio, the capacity of the storage capacitor is increased, the performance of a display panel is enhanced, and product competition power is improved.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) array substrate structure, comprising: a backing plate, a patterned metal light-shielding layer formed on the backing plate, a first insulation layer covering on the patterned metal light-shielding layer, a plurality of TFTs formed on the first insulation layer and arranged in an array, a planarization layer covering the TFTs, a common electrode formed on the planarization layer, a protection layer covering on the common electrode, and a patterned pixel electrode formed on the protection layer;
the TFTs each comprising a semiconductor layer formed on the first insulation layer, a gate insulation layer covering on the semiconductor layer, a gate electrode arranged on the gate insulation layer and located above the semiconductor layer, an interlayer dielectric layer formed on the gate electrode and the gate insulation layer, and a source electrode and a drain electrode formed on the interlayer dielectric layer;
the patterned metal light-shielding layer comprising a plurality of metal light-shielding blocks arranged in an array and a narrowed metal strip connected between two adjacent ones of the metal light-shielding blocks, each of the metal light-shielding blocks being arranged to correspond to and located under one of the semiconductor layers;
the metal light-shielding layer and the common electrode being both connected to and receiving a common voltage signal, the pixel electrode being set in engagement with the drain electrode of the TFT;
wherein for each of the TFTs, the pixel electrode has a portion overlapping the common electrode to form first storage capacitor and the metal light-shielding layer has a portion overlapping the drain electrode and the pixel electrode to form a second storage capacitor, the first storage capacitor and the second storage capacitor being connected in parallel.

2. The TFT array substrate structure as claimed in claim 1, wherein the semiconductor layer comprises a poly-silicon channel zone located at a middle portion and contact zones located at two ends and lightly doped zones sandwiched between the poly-silicon channel zone and the contact zones.

3. The TFT array substrate structure as claimed in claim 2, wherein each of the metal light-shielding blocks corresponds to and shields one of the poly-silicon channel zones.

4. The TFT array substrate structure as claimed in claim 2, wherein the source electrode and the drain electrode are respectively set in connection with the contact zones at the two ends of the semiconductor layer through vias formed through the interlayer dielectric layer and the gate insulation layer.

5. The TFT array substrate structure as claimed in claim 1, wherein the pixel electrode is set in connection with the drain electrode through a via extending through the protection layer, the common electrode, and the planarization layer.

6. The TFT array substrate structure as claimed in claim 1, wherein the metal light-shielding layer is formed of a material comprising molybdenum or titanium.

7. The TFT array substrate structure as claimed in claim 1, wherein the first insulation layer comprises, in sequence from bottom to top, a first silicon nitride layer and a first silicon oxide layer stacked on each other; and
the interlayer dielectric layer comprises, in sequence from bottom to top, a second silicon oxide layer and a second silicon nitride layer stacked on each other.

8. The TFT array substrate structure as claimed in claim 1, wherein the protection layer is made of a material comprising silicon nitride; and
the gate electrode is formed of a material comprising molybdenum and the source electrode and the drain electrode are formed of a material comprising two layers of molybdenum sandwiching therebetween a layer of aluminum.

9. The TFT array substrate structure as claimed in claim 1, wherein the pixel electrode and the common electrode are both formed of a material comprising indium tin oxide (ITO).

10. The TFT array substrate structure as claimed in claim 1, wherein the backing plate comprises a glass plate.

* * * * *